(12) United States Patent
Malametz

(10) Patent No.: US 6,634,231 B2
(45) Date of Patent: Oct. 21, 2003

(54) ACCELEROMETER STRAIN ISOLATOR

(75) Inventor: David L. Malametz, Lynnwood, WA (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/117,299

(22) Filed: Apr. 5, 2002

(65) Prior Publication Data
US 2002/0170355 A1 Nov. 21, 2002

Related U.S. Application Data
(60) Provisional application No. 60/291,245, filed on May 15, 2001.

(51) Int. Cl.⁷ .............................................. G01P 15/00
(52) U.S. Cl. ..................................................... 73/514.01
(58) Field of Search ........................ 73/514.01, 514.36, 73/514.37, 514.38, 514.29, 504.04, 862.195

(56) References Cited

U.S. PATENT DOCUMENTS

| | | | |
|---|---|---|---|
| 5,097,172 A | | 3/1992 | Becka |
| 5,165,279 A | * | 11/1992 | Norling et al. .......... 73/514.14 |
| 5,241,862 A | * | 9/1993 | Abbink et al. .......... 73/514.37 |
| 5,289,719 A | * | 3/1994 | Egley et al. ................ 73/497 |
| 5,331,853 A | * | 7/1994 | Hulsing, II .............. 73/514.29 |
| 5,331,854 A | * | 7/1994 | Hulsing, II .............. 73/514.37 |
| 5,392,650 A | | 2/1995 | O'Brien et al. |
| 5,496,436 A | | 3/1996 | Bernstein et al. |
| 5,650,568 A | | 7/1997 | Greiff et al. |
| 5,948,981 A | | 9/1999 | Woodruff ................. 73/514.29 |
| 5,996,411 A | * | 12/1999 | Leonardson et al. ..... 73/514.29 |
| 6,282,959 B1 | | 9/2001 | Blake et al. ............. 73/504.16 |

FOREIGN PATENT DOCUMENTS

| | | |
|---|---|---|
| DE | 198 17 357 A1 | 10/1999 |
| EP | 1 152 245 A2 | 11/2001 |
| WO | WO 00/79287 A1 | 12/2000 |

* cited by examiner

Primary Examiner—Richard A. Moller
(74) Attorney, Agent, or Firm—Charles J. Rupnick

(57) ABSTRACT

An apparatus and method for suspending and strain isolating a structure is provided, the apparatus having a first elongated flexure having first and second ends structured for connection to a support structure, and a second elongated flexure having first and second ends structured for connection to a structure to be isolated from the support structure. A portion of the second flexure intermediate the first and second ends thereof is interconnected to a portion of the first flexure intermediate the first and second ends thereof.

48 Claims, 3 Drawing Sheets

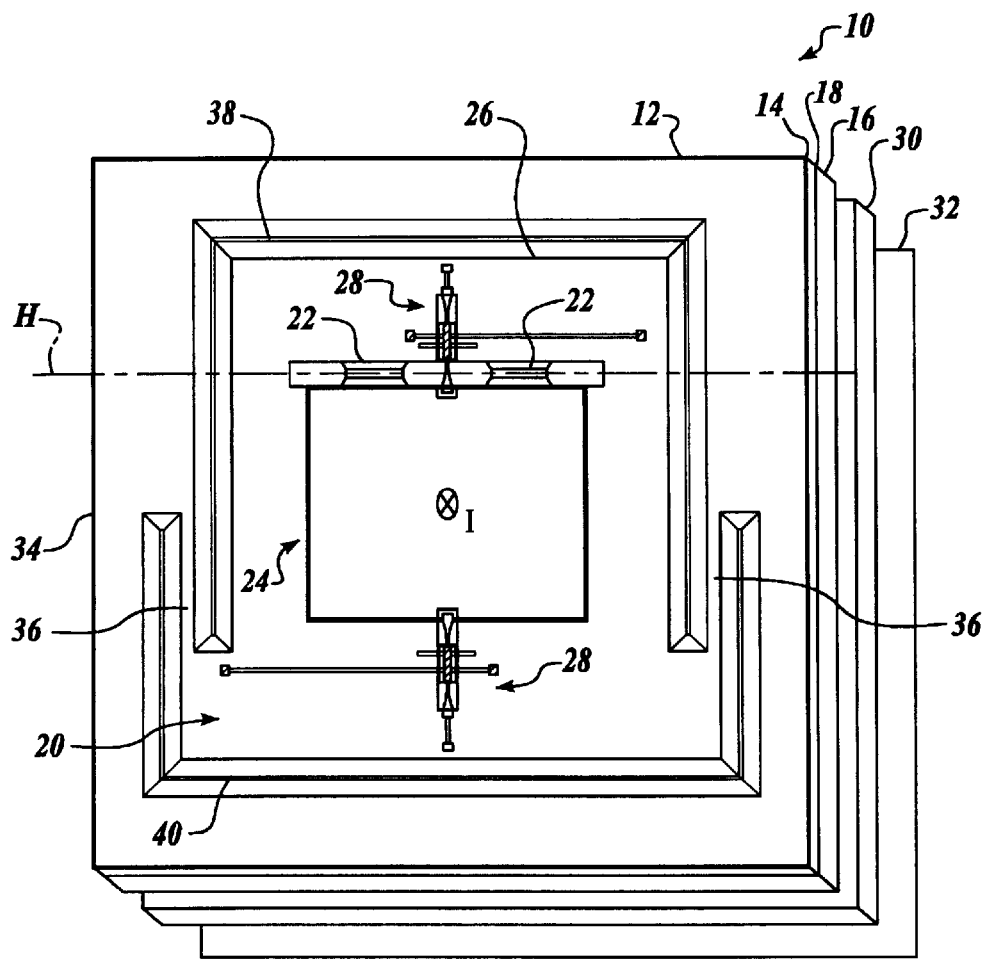
Fig. 1A. *(PRIOR ART)*
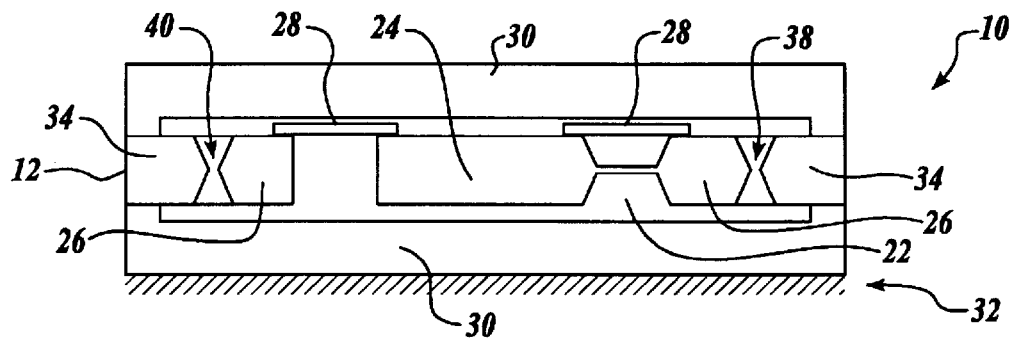
Fig. 1B. *(PRIOR ART)*

ACCELEROMETER STRAIN ISOLATOR

This application claims the benefit of U.S. Provisional Application Ser. No. 60/291,245, filed in the name of David L. Malametz on May 15, 2001, the complete disclosure of which is incorporated herein by reference.

FIELD OF THE INVENTION

The present invention relates to suspension devices and methods, and in particular to structures for mounting force-versus-displacement sensors, whereby external stress sources are isolated from active sensor components.

BACKGROUND OF THE INVENTION

Accelerometers generally measure acceleration forces applied to a body by being mounted directly onto a surface of the accelerated body. One common type of accelerometer employs one or more force-versus-displacement or "force/displacement" sensors for measurement of acceleration. Accelerometers employing two force/displacement sensors instead of the necessary minimum one sensor gain considerable advantage. If the two sensors operate in a push-pull mode, then many error sources such as thermally driven effects or drift may be rejected as common mode, while the difference signal represents the desired acceleration measurement. Occasionally, designs using two force/displacement sensors include two completely separate proof masses, which results in essentially two accelerometers, each having its own sensor, but operating in opposite directions. For numerous reasons, however, a two proof mass solution is not preferred. Rather, it is generally advantageous to have only one proof mass in an accelerometer.

A typical example of a prior art micromachined two-sensor/single proof mass accelerometer, commonly referred to as a Rectangle design, is illustrated in FIGS. 1A and 1B. The accelerometer 10 illustrated in FIGS. 1A and 1B is a miniature structure fabricated from a substrate 12 of semiconductor material by conventional micromachining techniques. The substrate 12 is formed of a monocrystalline silicon material in a substantially planar structure, i.e., having substantially planar and parallel opposing offset upper and lower surfaces. The silicon substrate 12 often includes an upper silicon or active layer 14 that is electrically isolated from an underlying substrate 16 by an insulating layer 18, or an insulating layer is applied to active layer 14, as shown and described in U.S. Pat. No. 5,948,981, entitled Vibrating Beam Accelerometer, issued on Sep. 7, 1999, and assigned to the Assignee of the present application, the entirety of which is incorporated herein by reference. The insulating layer 18 is may be a thin layer, e.g., about 0.1 to 10.0 micrometers, of an oxide, such as silicon oxide. The silicon substrate 12 is usually formed by oxidizing active layer 14 and underlying substrate 16, and adhering the two layers together. A portion of active layer 14 may be removed to bring the layer 14 to the desired thickness. The silicon oxide layer 18 retains its insulating properties over a wide temperature range to ensure effective mechanical resonator performance at high operating temperatures on the order of 100 degrees Celsius. In addition, the insulating layer 18 inhibits undesirable etching of the active layer 14 during manufacturing.

The micromachined accelerometer 10 includes an acceleration sensor mechanism 20 having one or more flexures 22 pliantly suspending a proof mass 24 from an inner sensor frame or plate 26 for movement of the proof mass 24 along an input axis I normal to the proof mass 24. The flexures 22 are preferably etched near or at the center of the underlying substrate 16, i.e., substantially centered between the opposing upper and lower surfaces of the underlying substrate 16. Optionally, the flexures 22 are formed by anistropically etching in a suitable etchant, such as potassium hydroxide (KOH). The flexures 22 define a hinge axis H about which the proof mass 24 moves in response to an applied force, such as the acceleration of the accelerated body, for example, a vehicle, aircraft or other moving body having the accelerometer 10 mounted thereon. The sensor mechanism 20 includes a pair of force/displacement sensors 28 coupled between the proof mass 24 and the sensor frame 26 for measuring forces applied to the proof mass 24. The force/displacement sensors 28 are, for example, mechanical resonators formed from the active silicon layer 14 as double-ended tuning fork (DETF) force sensors.

A known oscillator circuit, shown in FIG. 1C and described in above-incorporated U.S. Pat. No. 5,948,981, drives the mechanical resonators 28 at their resonance frequency. FIG. 1C illustrates a representative oscillation circuit 50 in which vibrating beams of the transducers 28 function as a resonator. A transimpedance amplifier 52 converts a sense current received from vibrating beams to a voltage. This voltage is filtered by a bandpass filter 54, which reduces noise, and the voltage amplitude is controlled by an amplitude limiter 56. The resulting signal is combined with the output or DC bias voltage from a DC source 58 in a summing junction 60. The DC bias voltage generates a force between electrodes and the beams of the force/displacement sensors 28. The signal from amplitude limiter 56 modulates this force causing the beams of the transducers 28 to vibrate laterally at their resonant frequency. This lateral beam motion, in turn, generates the sense current. An output buffer 62 isolates the oscillator from external circuitry connected to an output 64 of oscillation circuit 50. The gain in oscillation circuit 50 sustains oscillation of the beams of the force/displacement sensors 28.

In response to an applied force, the proof mass 24 rotates about the hinge axis H, causing axial forces, either compressive or tensile, to be applied to the mechanical resonators 28. The axial forces change the frequency of vibration of the mechanical resonators 28, and the magnitude of this change serves as a measure of the applied force or acceleration. In other words, the force/displacement sensors 28 measure the applied acceleration force as a function of the displacement of the proof mass 24.

Undesirable external stresses and strains may be induced in the sensitive acceleration sensor mechanism 20 by, for example, mechanical coupling of the accelerometer sensor frame 26 to a silicon cover plate 30 which in turn is typically connected to a ceramic or metal mounting plate 32. Any strains occurring in the sensor frame 26 are transmitted not only to the proof mass 24, but through the proof mass 24 to the two DETF resonators 28. Since the only significant compliance in the system is the sensing DETF resonators 28 themselves, almost the entire strain appears as an error output from the DETF resonators 28. Thus, undesirable errors are generated in the DETF resonators 28 from inputs having nothing to do with the acceleration being measured. These errors can be quite large since the compliance through the DETF resonators 28 must be low to detect acceleration with sufficient accuracy to be useful in practical systems.

Strain isolation within the micro-machined accelerometers is thus of paramount importance for good performance, i.e., accuracy. Strain isolation separates the mechanism from stresses mechanically induced during fabrication and assembly, and thereby reduces variations in resonance within the beams of the two vibrating-beam force sensing portion of the accelerometer mechanism. Strain isolation also separates the mechanism from stresses externally induced by shock, vibration and temperature variation within the operating environment.

Many methods are known for isolating the sensitive acceleration sensor mechanism 20 from such undesirable stresses and strains. Typically, cantilever-style isolation is provided wherein the sensor frame 26 is suspended from a second outer or external frame portion 34 by flexures 36 formed by overlapping slots 38 and 40 through the substrate 12. The sensor frame 26 is thus able to move relative to the outer frame 34, as shown and described in U.S. Pat. No. 5,948,981, which is incorporated herein. Such isolation minimizes the distortion of the sensor frame 26, and thereby decreases the effects of external stresses and strains on the mechanical resonators 28.

FIG. 1B is a cross-section view taken through the micromachined accelerometer 10 along the resonators 28. As discussed above and shown in FIG. 1B, the proof mass 24 is free to rotate about the flexures 22 when subjected to acceleration along the input axis I according to the principle of Newton's law, F=ma. This rotation is constrained by the action of two force/displacement sensors 28, shown as DETF resonators, positioned on a surface of the mechanism as shown. These two vibrating beam force sensors 28 provide push-pull variable frequency output signals since, when the proof mass 24 is displaced relative to the plane of the sensor mechanism 20, one DETF resonator 28 is under compression while the other is under tension. The difference between the two frequencies represents the measured acceleration. Common mode frequency shifts, on the other hand, are rejected as errors driven by unwanted sources such as temperature, mechanism stress, or drift. FIGS. 1A and 1B thus demonstrate the cantilever-style isolation provided by the prior art.

Prior art designs have effectively used the cantilever-style strain isolation, new applications continually reduce the space available for the accelerometer. New constraints are placed upon the space available within the accelerometer for strain isolation. These new space constraints do not permit the cantilever-style strain isolation of the prior art. Accelerometer designers are thus challenged in providing sufficient strain isolation within minimum spacing.

SUMMARY OF THE INVENTION

The present invention overcomes size limitations of the prior art for providing on-die strain isolation, which is critical to isolating the accelerometer mechanism from externally induced stresses and the resultant strains, including strains induced during fabrication and assembly, cover plate attachment, header mounting, and environmental conditions during operation. The H-Beam strain isolator of the invention minimizes the impact of strains induced exterior to the die. The H-Beam strain isolator also provides for a symmetric strain isolation system, which reduces nonlinear effects such as those caused by eccentricities. The H-Beam strain isolator also minimizes alignment rotation error caused by the strains.

According to one aspect of the invention, a suspension structure is provided having a first elongated flexure having first and second ends structured for connection to a support structure, and a second elongated flexure having first and second ends structured for connection to a structure to be isolated from the support structure. A portion of the second flexure intermediate the first and second ends thereof is interconnected to a portion of the first flexure intermediate the first and second ends thereof.

According to another aspect of the invention, the first and second flexures of the suspension structure are spaced apart and interconnected by an interconnecting structure connected between the intermediate portion of the first flexure and the intermediate portion of the second flexure.

According to another aspect of the invention, each of the first and second flexures of the suspension structure are formed in a substrate having substantially parallel opposing offset upper and lower surfaces, the first and second flexures being defined by a plurality of slots formed through the substrate between the upper and lower surfaces.

According to another aspect of the invention, when in an unconstrained condition, each of the first and second flexures of the suspension structure is substantially straight between its respective first and second ends. In the unconstrained condition the first and second flexures of the suspension structure may be spaced apart and substantially mutually parallel and have an interconnecting structure connected therebetween.

According to another aspect of the invention, the suspension structure of the invention may also include a structure to be suspended and a support structure at least partially surrounding the structure to be suspended and spaced away therefrom. The first and second ends of the first flexure are connected to the support structure, and the first and second of the second flexure are connected to the structure to be suspended, which may be an accelerometer sensor mechanism.

According to still other aspects of the invention, methods for suspending and isolating an acceleration apparatus are provided.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1A is a plan view of a typical prior art two-sensor/single proof mass accelerometer, commonly referred to as a Rectangle design;

FIG. 1B is a cross-sectional view of the accelerometer illustrated in FIG. 1;

DETAILED DESCRIPTION OF PREFERRED EMBODIMENT

In the Figures, like numerals indicate like elements.

The present invention is an apparatus and method for suspending an acceleration sensor, the suspension apparatus including a first elongated flexure having first and second ends structured for connection to a support structure; and a second elongated flexure having first and second ends structured for connection to a structure to be isolated from the support structure, a portion of the second flexure intermediate the first and second ends thereof being interconnected to a portion of the first flexure intermediate the first and second ends thereof.

Figure 2:
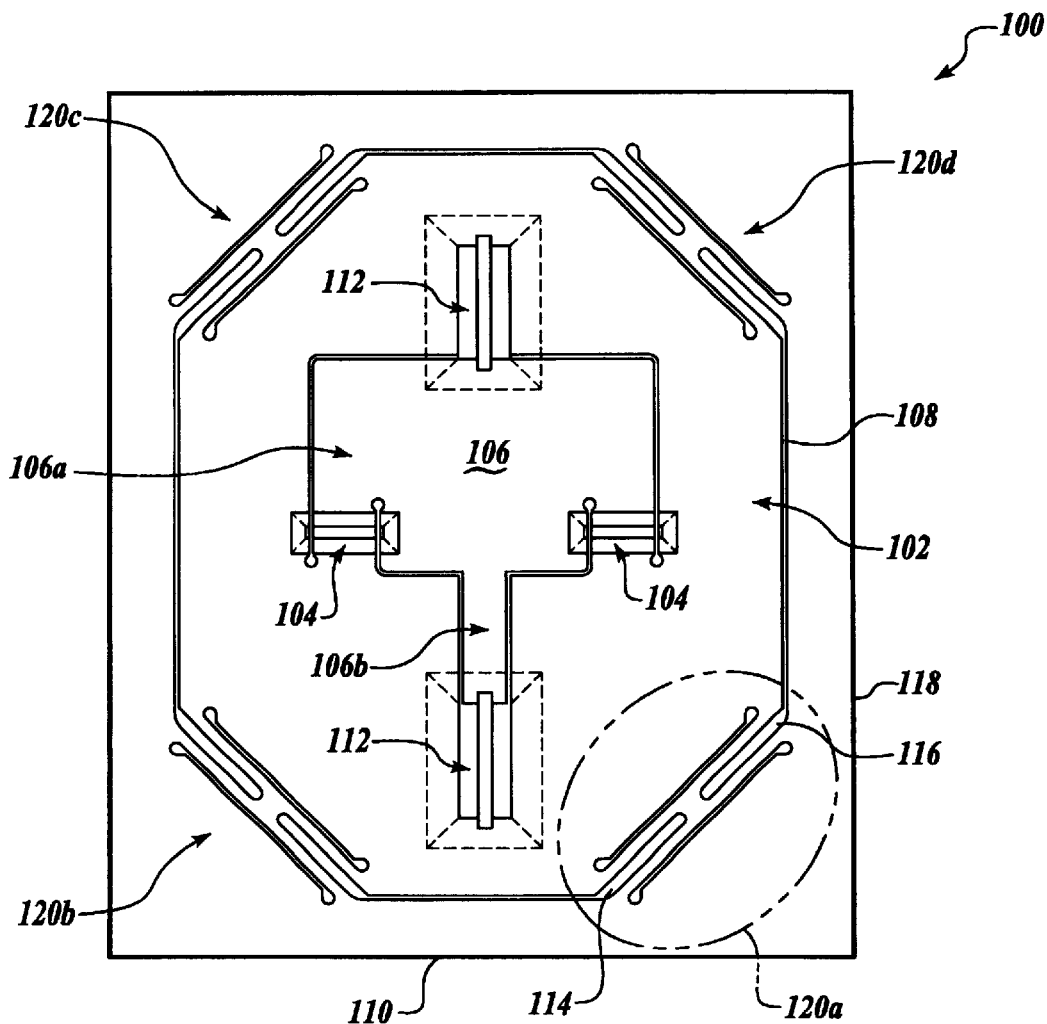
FIG. 2 is a plan view of an accelerometer mechanism die featuring the H-beam isolation structure of the invention that minimizes and localizes end-torques applied to the accelerometer mechanism die.

FIG. 2 illustrates one embodiment of the suspension structure and method of the invention that provides isolation that minimizes and localizes end-torques applied to an accelerometer mechanism die. The structure of the invention suspends the accelerometer sensor mechanism while isolating it from externally induced strains. Strains in the outer frame are transmitted through the isolation structure as equal and opposite moments. Therefore, end-torques applied to the accelerometer mechanism through the isolation structure operate in opposite in directions. The H-beam isolation geometry illustrated in FIG. 2 thus ensures that only a resultant tensile or compressive load is applied to the accelerometer mechanism. One drawback to the prior art cantilever-style isolation is that the cantilever-style isolation have cross-axis effects or a dual-beam suspension isolation, which tend to "water witch" or box out of plane. This tendency to box out of plane is avoided by the feature of the H-beam isolation geometry of the present invention that ensures that only tensile or compressive loads are applied to the accelerometer mechanism. The H-beam isolation geometry of the present invention thus provides a distinct advantage over the cantilever-style isolation of the prior art.

In FIG. 2 the micromachined accelerometer 100 of the invention includes an accelerometer sensor mechanism 102 substantially the same as one of the accelerometer sensor mechanisms described in the references incorporated herein. The accelerometer sensor mechanism 102 includes, for example, one or more flexures 104 pliantly suspending a proof mass 106 from an inner sensor frame or plate 108 for movement of the proof mass 106 along an input axis I normal to the proof mass 106. The exemplary proof mass 106 illustrated in FIG. 2 is of a type described in U.S. Pat. No. 6,282,959, entitled, Compensation of Second-Order Non-Linearity in Sensors Employing Double-Ended Tuning Forks, which is incorporated in its entirety herein by reference and is assigned to the assignee of the present application. The proof mass 106 illustrated in FIG. 2 thus includes, for example, a first plate portion 106a and a second tail portion 106b positioned on opposite sides of the flexures 104. As will be understood by those of skill in the art, the suspension/isolation geometry of the present invention is equally practicable with other accelerometer designs, including but not limited to those other accelerometer designs described in U.S. Pat. No. 6,282,959.

The flexures 104 are preferably etched at a position substantially centered between the opposing upper and lower surfaces of the underlying substrate 110, which is formed according to prior art teachings having substantially planar and parallel opposing offset upper and lower surfaces and including an upper silicon or active layer that is electrically isolated from an underlying substrate by an insulating layer. The flexures 104 are optionally formed by anistropically etching in a suitable etchant, such as potassium hydroxide (KOH). The flexures 104 define a hinge axis H about which the proof mass 106 moves in response to an applied force, such as the acceleration of the accelerated body, for example, a vehicle, aircraft or other moving body having the accelerometer 100 mounted thereon. The sensor mechanism 102 includes a pair of force/displacement sensors 112 coupled between the proof mass 106 and the sensor frame 108 for measuring forces applied to the proof mass 106. The force/displacement sensors 112 are, for example, mechanical resonators formed from the active silicon layer as the double-ended tuning fork (DETF) force sensors 28 described in the prior art teachings that are incorporated herein, or another suitable force/displacement sensor.

Figure 1C:
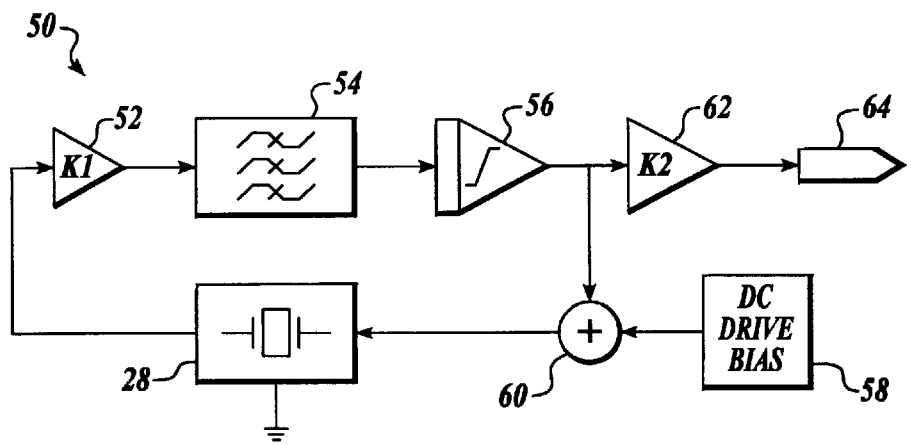
FIG. 1C is a diagram of a known oscillator circuit useful for driving at their resonance frequency the mechanical resonators of a two-sensor/single proof mass accelerometer.

An oscillator circuit, for example, the oscillator circuit 50 shown in FIG. 1C and described in above-incorporated U.S. Pat. No. 5,948,981, is coupled to drive the mechanical resonators 112 at their resonance frequency. The force/displacement sensors 112 operate in a push-pull mode as described herein to measure the applied acceleration force as a function of displacement of the proof mass 106 in response to forces applied along the input axis I.

A quantity of separation slots 114 and 116 are formed through the substrate 110 and nearly separate the inner sensor frame 108 from a second outer or external frame portion 118. The slots 114, 116 are formed along the periphery of the inner sensor frame 108 and meet in a quantity of suspension structures 120a, b, c and d of the invention interconnected between the inner and outer sensor frames 108 and 118. The quantity of suspension structures 120a, b, c, d of the invention are the only mechanical interconnection between the inner and outer sensor frames 108, 118. The inner sensor frame 108 of the sensor mechanism 102 is thus surrounded by and suspended from the outer frame 118 by the quantity of the suspension structures 120a, b, c, d, which simultaneously isolate the sensor mechanism 102 from strains in the outer frame 118.

Figure 3:
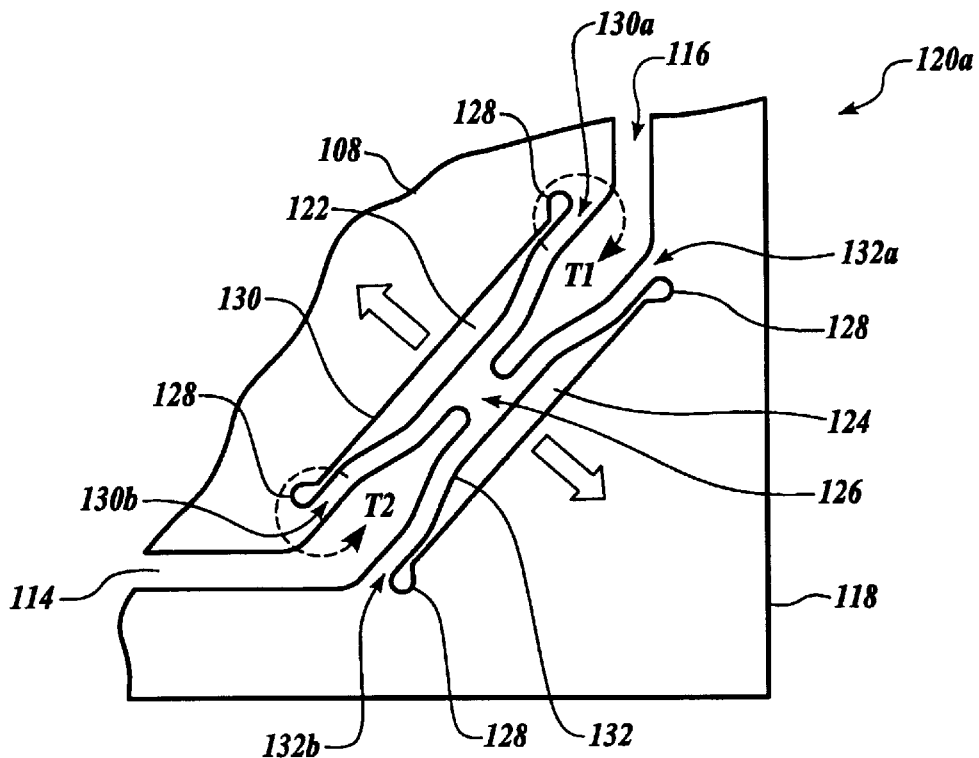
FIG. 3 illustrates the suspension structure of the invention embodied as an H-beam isolation structure, and further illustrates the operation thereof.

FIG. 3 illustrates the suspension structure of the invention embodied as one of the H-beam isolation structures 120a. The other H-beam isolation structures 120b, c, d are similarly configured. In FIG. 2 the H-beam isolation geometry 120a is formed by a pair of inner and outer slots 122 and 124 formed through the substrate 110 and overlapping a portion of slots 114 and 116 between the inner and outer sensor frames 108, 118.

The inner and outer slots 122, 124 of the H-beam isolation flexure 120a are formed on opposite sides of the separation slots 114 and 116. In other words, the inner slot 122 is formed through the inner sensor frame 108, while the outer slot 124 is formed through the outer frame 118. Keyholes 128 may be formed at the extreme ends of the slots 122, 124 to provide stress relief. The inner slot 122 and outer slot 124 are, for example, long narrow slots spaced slightly away from the separation slots 114 and 116 and substantially parallel therewith. An elongated inner flexure 130 is formed where the inner slot 122 overlaps portions of the separation slots 114 and 116, and an elongated outer flexure 132 is formed where the outer slot 124 overlaps portions of the separation slots 114 and 116. When the inner and outer slots 122, 124 are mutually aligned and have substantially the same length, the inner and outer flexures 130, 132 are also mutually aligned and substantially identical in length.

The H-beam isolation structures 120a includes a narrow beam 126 formed orthogoanally to the plane of the sensor substrate 110 and interconnected between the inner and outer sensor frames 108 and 118 through the inner and outer flexures 130, 132. The beam 126 is centered on the two flexures 130, 132 so that the beam 126 is interconnected to each of the inner and outer flexures 130, 132 intermediately between their respective end points at the keyhole portions 128 of the respective inner and outer slots 122, 124. The inner and outer flexures 130, 132 may be substantially straight due to the inner and outer slots 122, 124 and the portions of the separation slots 114 and 116 overlapped by the inner and outer slots 122, 124 each being formed substantially straight and mutually parallel. In such instance of the inner and outer flexures 130, 132 being substantially straight, the intermediately interconnected beam 126 connects the two pairs of flexures 130, 132 in an H configuration.

As described above, the H-beam isolators 120a, b, c, d are formed of an outer elongated flexure 132 having first and second ends structured for connection to the outer frame structure 118, and an inner elongated flexure 130 having first and second ends structured for connection to the inner sensor frame structure 108 that is to be isolated from the outer frame structure 118. A portion of the inner flexure 130 intermediate the first and second ends thereof is interconnected by the beam 126 to a portion of the outer flexure 132 intermediate the first and second ends thereof.

However, the H-beam isolators 120a, b, c, d can also be described as being formed of a pair of inner flexures 130a, 130b and a pair of outer flexures 132a, 132b spaced away therefrom with proximal ends of each of the flexures 130a, 130b and the outer flexures 132a, 132b being interconnected by the beam 126. The ends of the inner flexures 130a, 130b distal from the interconnecting beam 126 being interconnected with the inner sensor frame structure 108, and ends of the outer flexures 132a, 132b distal from the interconnecting beam 126 being interconnected with the outer frame structure 118.

Compliance of the H-beam flexures 130, 132 is determined as a function of the length of the H-beam slots 122, 124 in combination with the width of the beam 126 connecting them and the set-back from the sides of the separation slots 114 and 116. The length of the inner and outer H-beam slots 122, 124 and the width of the interconnecting beam 126 are thus selected in combination with the set-back from the slots 114 and 116 to provide a predetermined dynamic characteristic to the accelerometer mechanism 100. The H-beam flexures 130, 132 extend the full thickness of the substrate 110 so that they are very stiff in the input axis I of the accelerometer device 100, while their relative thinness makes them relatively compliant in the plane of the substrate 110. Those of ordinary skill in the art will recognize that longer, thinner flexures 130, 132 will be more compliant and result in a lower system frequency, while shorter, thicker flexures 130, 132 will be stiffer and result in a system having a higher frequency resonance. In practice, the length and width of the inner and outer flexures 130, 132 are selected in combination with other features of the accelerometer mechanism 100, for example, using a finite element computer program, to achieve a system characteristics appropriate to a specific application.

The H-beam isolators 120 are repeated around sensor mechanism 102 between the inner and outer frames 108, 118. For example, the H-beam isolators 120 are repeated at all four corners of a square or rectangular (shown) inner sensor frame 108. The H-beam isolators 120 are optionally repeated at all four cardinal points, i.e., top, bottom and both sides of a square or rectangular inner sensor frame 108. If the inner sensor frame is another shape, such as a circle or ellipse, the H-beam isolators 120 are again repeated at the cardinal points, or are rotated at a predetermined angle, for example, 45 degrees as shown. The four-point symmetry of the H-beam isolators 120 shown in FIG. 2 provides a broad stable support for the sensor mechanism 102. However, three-point symmetry, e.g., three H-beam isolators 120 being spaced symmetrically around a circular inner sensor frame 108, is also an option.

The portions of the separation slots 114, 116 between the H-beam flexures 130, 132 are formed wide enough to permit flexing of the inner and outer flexures 130, 132. The separation slots 114, 116 thus provide space for relative motion between the inner sensor frame 108 and the outer frame 118 perpendicular to the H-beam flexures 130, 132. The H-beam isolators 120 thus permit a maximum amount of in-plane linear translation of the inner sensor frame 108 within a minimal space. Selected portions of the separation slots 114, 116 may however be formed narrow enough to limit or cage the relative motion of the inner sensor frame 108 so that the H-beam flexures 130, 132 are not damaged by over-flexing. Alternatively, portions of the slots 114, 116 around the periphery of the inner sensor frame 108 external to the H-beam isolators 120 are optionally selected to limit motion of the inner sensor frame 108 relative to the outer frame 118 so that the H-beam flexures 130, 132 are protected from over-flexing. The caging provided by the narrow portions of the slots 114, 116 also protect the accelerometer sensor mechanism 102 from damage due to external shock loads applied cross-axis.

As illustrated in FIG. 2, the H-beam isolators 120a, b, c, d are symmetrically oriented relative to the hinge axis H of the accelerometer sensor mechanism 102. However, according to different embodiments of the invention, the different H-beam isolators 120a, b, c, d are oriented at different angles such that the pattern of the different H-beam isolators 120a, b, c, d is coincident at a single point on the accelerometer sensor mechanism 102. Orienting the pattern of H-beam isolators 120a, b, c, d to be coincident at a single point is used to minimize eccentric effects. For example, the pattern of H-beam isolators 120a, b, c, d is optionally oriented to be coincident at a center of percussion of the proof mass 106 in a high vibration application to limit the eccentric effects. In other applications, the pattern of H-beam isolators 120a, b, c, d is optionally oriented to be coincident at a center of mass or center of gravity of the proof mass 106.

According to one alternative embodiment, each of the flexures 130, 132 in the H-beam isolator structure 120 is of different length. While having flexures 130, 132 of substantially the same length aids symmetry, desired resulting resonant frequencies may dictate differential flexure lengths.

The H-beam slots 122, 124 and the separation slots 114, 116 that form the H-beam flexures 130, 132 are optionally fabricated using Deep Reaction Ion Etching (DRIE), which permits etching of very narrow slots between nearly vertical walls. DRIE permits the width, length, and thickness of the H-beam isolation flexures 130, 132 to be closely controlled so that a selected level of strain isolation and corresponding resonance can be fabricated into the structure of the accelerometer 100.

FIG. 3 illustrates the method of the invention as embodied in the operation of the H-beam isolator 120a in combination with an accelerometer mechanism die. In FIG. 3, as indicated by the arrows, a spreading motion of the H-beam isolator 120a is illustrated in combination with the accelerometer mechanism 100. An equal and opposite compression motion is experienced by another one of the H-beam isolators 120c. When strains are induced in the outer frame member 118, the in-plane compliance of the H-beam flexures 130, 132 permit them to flex in the plane of the substrate 110 while remaining relatively stiff and inflexible along the input axis I of the accelerometer mechanism 100. The H-beam isolators 120 thereby absorb the strains occurring in the outer frame member 118 while maintaining co-planarity of the inner sensor frame 108 and sensor mechanism 102 with the outer frame member 118.

Furthermore, the flexing of the H-beam flexures 130, 132 minimizes and localizes end-torques applied to the accelerometer mechanism die 100. The strains in the outer frame member 118 are transmitted into the outer flexures 132 formed in the outer frame 118, through the interconnecting beam 126, and into the inner flexures 130 formed on the inner sensor frame 108. The outer flexure 132 and the interconnecting beam 126 thus operate to cause the strains in the outer frame member 118 to be applied at the inner ends of the two cantilevered flexures 130a and 130b, i.e., at the center of the inner flexure 130. The strains are converted into a moment transmitted over the two moment arms of the cantilevered flexures 130a, 130b and generate torques T1 and T2 in the inner sensor frame 108 at the ends of the respective flexures 130a, 130b where they interconnect with the inner sensor frame 108.

However, because the external strains are applied through the beam 126 between the two symmetrically shaped flexures 130a, 130b, equal and opposite moments are applied by each of two flexures 130a, 130b. These equal and opposite moments result in equal and opposite torques T1 and T2 generated in the inner sensor frame 108 at the ends of the flexures 130a, 130b so that only a resultant compressive or tensile load (shown) is applied to the accelerometer sensor mechanism 102.

In similar but opposite manner the H-beam isolator 120c is compressed when the H-beam isolator 120a on the opposite corner of the inner sensor frame 108 is expanded. The H-beam isolator 120c flexes to minimize and localize end-torques applied to the accelerometer mechanism die 100. The H-beam isolator 120c operates in compression similarly to the H-beam isolator 120a in tension to convert the externally generated strains to equal and oppositely acting torques at the extreme ends of the flexures formed in the body of the inner sensor frame 108. These equal and opposite torques generated in the inner sensor frame 108 result in applying a compressive load to the accelerometer sensor mechanism 102.

Figure 4:
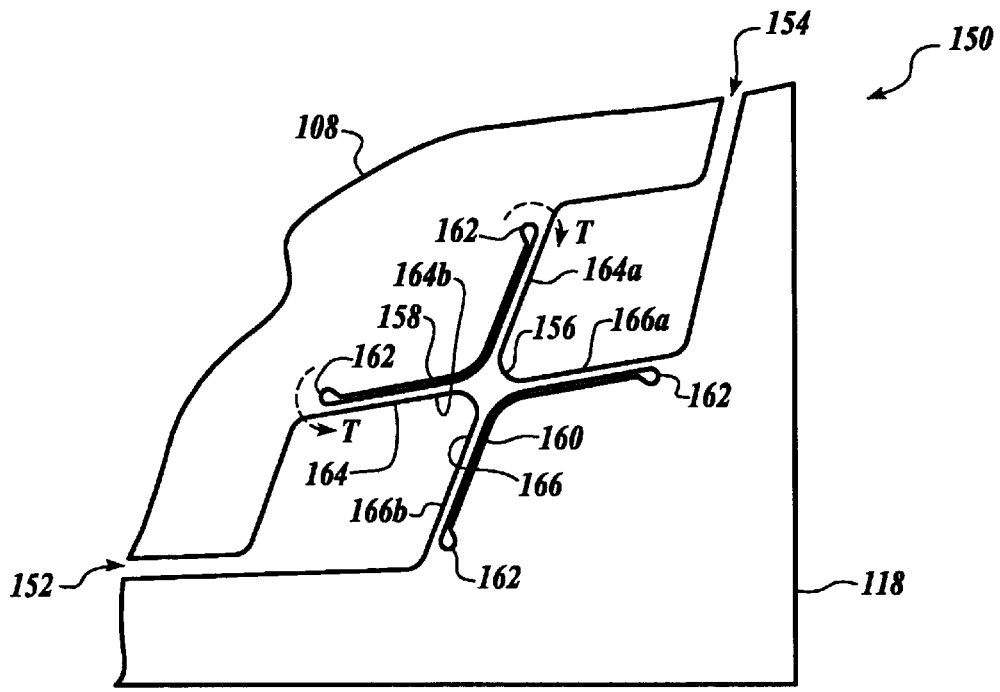
FIG. 4 illustrates the suspension structure of the invention embodied as an X-beam isolation structure.

FIG. 4 illustrates the suspension structure of the invention embodied as an X-beam isolator 150, which is similar in construction and operation to the H-beam isolator 120 described herein. The X-beam isolator 150 however requires more physical space to construct and operate than does the H-beam embodiment discussed above. According to the X-beam isolator 150, separation slots 152, 154 are formed along the periphery of the inner sensor frame 108 and meet in a narrow beam 156 connected between the inner and outer sensor frames 108 and 118. The beam 156 is formed orthogoanally to the plane of the sensor substrate 110 for the full thickness of the substrate 110. A quantity of the beams 156 is the only mechanical interconnection between the inner and outer sensor frames 108, 118. Inner and outer slots 158, 160 of the X-beam isolation flexure 150 are formed on opposite sides of and partially overlap the separation slots 152 and 154, with the interconnecting beam 156 formed intermediate the inner and outer slots 158, 160. In other words, the inner slot 158 is formed through the outer peripheral edge of the inner sensor frame 108, while the other outer slot 160 is formed through the inner peripheral edge of the outer sensor frame 118. Keyholes 162 are formed at the extreme ends of the slots 158, 160 to provide stress relief. The inner slot 158 and outer slot 160 are, for example, long narrow slots spaced slightly away from the overlapping slots 152 and 154 so that two elongated flexures 164 and 166 are formed respectively therebetween. The slots 152, 154 are positioned so that the beam 156 connects the two pairs of flexures 164, 166 in an X configuration.

The X-beam isolators 150 can also be described as being formed of a pair of inner flexures 164a, 164b and a pair of outer flexures 166a, 166b spaced away therefrom with proximal ends of each of the flexures 164a, 164b and the outer flexures 166a, 166b being interconnected by the beam 156. The ends of the inner flexures 164a, 164b distal from the interconnecting beam 156 being interconnected with the inner sensor frame structure 108, and ends of the outer flexures 166a, 166b distal from the interconnecting beam 156 being interconnected with the outer frame structure 118.

Similar to the H-beam embodiment of the invention, compliance of the X-beam isolation flexures 150 is a function of the length of the X-beam slots 158, 160 in combination with the width of the beam 156 connecting them and the set-back from the sides of the separation slots 152 and 154. The length of the X-beam slots 158, 160 and the width of the beam 156 connecting them are thus selected in combination with the set-back from the sides of the overlapping slots 152 and 154 to provide a predetermined dynamic characteristic to the accelerometer mechanism 100.

The isolation geometry of the suspension invention embodied as the X-beam isolators 150 operates in a spreading motion, while an equal and opposite compression motion is experienced by another one of the X-beam isolators 150 on the opposite side or corner of the inner sensor frame 108. When strains are induced in the outer frame member 118, the in-plane compliance of the X-beam flexures 164, 166 permit them to flex in the plane of the substrate 110 while remaining relatively stiff and inflexible along the input axis I of the accelerometer mechanism 100. The X-beam isolators 150 thereby absorb the strains occurring in the outer frame member 118 while maintaining the co-planarity of the inner sensor frame 108 and sensor mechanism 102 with the outer frame member 118.

Flexing of the X-beam flexures 164, 166 minimizes and localizes end-torques applied to the accelerometer mechanism die 100. The strains in the outer frame member 118 are transmitted into the flexures 166a, 166b formed in the outer frame 118, through the interconnecting beam 156 and into the flexures 164a, 164b formed on the inner sensor frame 108. The two flexures 166a, 166b and the interconnecting beam 156 thus operate to cause the strains in the outer frame member 118 to be applied at the inner ends of the two cantilevered flexures 164a, 164b. The strains are converted into a moment transmitted over the two moment arms of the cantilevered flexures 164a, 164b and generate equal and opposite torques in the inner sensor frame 108 at the ends of the flexures 164a, 164b where they interconnect with the inner sensor frame 108. These equal and opposite moments result in equal and opposite torques generated in the inner sensor frame 108 at the ends of the flexures 164a, 164b so that only a resultant compressive or tensile load is applied to the accelerometer sensor mechanism 102.

Those of skill in the art will further recognize that the isolation structure of the invention is equally practicable for isolating a sensor mechanism 102 formed in or on the outer frame 118 from external strains applied to the inner frame 108 when the inner frame 108 is coupled to the cover plates 32 to mount the accelerometer 100.

While the preferred embodiment of the invention has been illustrated and described, it will be appreciated that various changes can be made therein without departing from the spirit and scope of the invention.

What is claimed is:

1. A suspension structure comprising:
    a first elongated flexure having first and second ends structured for connection to a support structure; and
    a second elongated flexure having first and second ends structured for connection to a structure to be isolated from the support structure, a portion of the second flexure intermediate the first and second ends thereof being interconnected to a portion of the first flexure intermediate the first and second ends thereof.

2. The structure of claim 1 wherein the first and second flexures are spaced apart and interconnected by an interconnecting structure connected between the intermediate portion of the first flexure and the intermediate portion of the second flexure.

3. The structure of claim 1 wherein each of the first and second flexures are formed in a substrate having substantially parallel opposing offset upper and lower surfaces, the first and second flexures being defined by a plurality of slots formed through the substrate between the upper and lower surfaces.

4. The structure of claim 1 wherein in an unconstrained condition each of the first and second flexures is substantially straight between its respective first and second ends.

5. The structure of claim 4 wherein in an unconstrained condition the first and second flexures are spaced apart and substantially mutually parallel and having an interconnecting structure connected therebetween.

6. The structure of claim 1 further comprising:
a structure to be suspended;
a support structure at least partially surrounding the structure to be suspended and spaced away therefrom; and
wherein:
the first and second ends of the first flexure are connected to the support structure, and
the first and second of the second flexure are connected to the structure to be suspended.

7. The structure of claim 6 wherein the structure to be suspended further comprises an accelerometer sensor mechanism.

8. An accelerometer suspension apparatus comprising:
a means for measuring acceleration applied along an input axis;
a means for supporting the acceleration measuring means;
a means interconnected between the supporting means and the acceleration measuring means for suspending the acceleration measuring means from the supporting means for limited motion in a plane substantially perpendicular to the input axis, the suspending means comprising:
a plurality of first flexure means each having spaced apart interconnecting means for interconnecting to the supporting means,
a plurality of second flexure means each having spaced apart interconnecting means for interconnecting to the acceleration measuring means, and
means for interconnecting each of the plurality of first flexure means with a respective one of the plurality of second flexure means at a position substantially intermediate between the respective spaced apart interconnecting means.

9. The apparatus of claim 8 wherein:
a first of the interconnecting means is positioned on a first side of acceleration measuring means; and
a second of the interconnecting means is positioned on a second side of the acceleration measuring means opposite from the first interconnecting means.

10. The apparatus of claim 8 wherein the acceleration measuring means, the supporting means, and each of the interconnecting means is formed in a substrate having a thickness extending between substantially parallel spaced apart surfaces.

11. The apparatus of claim 10 wherein the first and second flexure means of each of the plurality of interconnecting means extends through substantially the entire thickness between the spaced apart surfaces of the substrate.

12. The apparatus of claim 8 wherein the spaced apart interconnecting means of each of the plurality of second flexure means for interconnecting to the acceleration measuring means further comprises means for converting into a torque a strain transmitted by the respective second flexure means.

13. The apparatus of claim 12 wherein the strain-to-torque converting means at each of the spaced apart interconnecting means further comprises a means for converting the strain into equal and opposite torques.

14. A suspension structure comprising:
a substrate having substantially parallel and spaced apart top and bottom surfaces;
an inner frame member formed in the substrate;
an outer frame member formed in the substrate, the outer frame member spaced away from and substantially surrounding the inner frame member;
a separation slot formed between the inner and outer frame members, the separation slot being defined by an outer side wall of the inner frame member and an inner side wall of the outer frame member spaced away from the outer side wall of the inner frame member and being contiguous therewith;
a plurality of beams formed in the substrate within the separation slot at spaced positions around an outer periphery of the inner frame member, each of the beams being interconnected between the inner and outer frame members;
an inner slot formed in the outer periphery of the inner frame member and adjacent to but spaced away from the outer side wall thereof, the inner slot having first and second spaced apart ends positioned on opposite sides of a first beam substantially equidistantly therefrom; and
an outer slot formed in an inner periphery of the outer frame member and adjacent to but spaced away from the inner side wall, the outer slot having first and second spaced apart ends positioned on opposite sides of the first beam substantially equidistantly therefrom.

15. The suspension structure of claim 14 wherein the inner and outer slots are formed substantially contiguously.

16. The suspension structure of claim 14 wherein the inner slot is formed substantially parallel with the separation slot, and the first and second ends of the inner slot are spaced apart a predetermined elongated distance, such that an inner flexure is formed between the inner slot and the separation slot.

17. The suspension structure of claim 14 wherein the outer slot is formed substantially parallel with the separation slot, and the first and second ends of the outer slot are spaced apart a predetermined elongated distance, such that an outer flexure is formed between the outer slot and the separation slot.

18. The suspension structure of claim 14, further comprising:
a second inner slot formed in the outer periphery of the inner frame member and adjacent to but spaced away from the outer side wall thereof, the inner slot having first and second spaced apart ends positioned on opposite sides of a second one of the beams substantially equidistantly therefrom; and
a second outer slot formed in an inner periphery of the outer frame member and adjacent to but spaced away from the inner side wall, the outer slot having first and second spaced apart ends positioned on opposite sides of the second one of the beams substantially equidistantly therefrom.

19. The suspension structure of claim 18 wherein:

the first beam, the first inner slot and the first outer slot are formed at a first position on a first side of the inner frame member; and the second beam, the second inner slot and the second outer slot are formed at a second position on a second side of the inner frame member opposite from the first beam, inner slot and outer slot.

20. The suspension structure of claim 19 wherein:

the first beam, the first inner slot and the first outer slot cooperate to form a first flexure that is operable along a line passing through the first beam;

the second beam, the second inner slot and the second outer slot cooperate to form a second flexure that is operable along a line passing through the second beam; and the first and second flexures are oriented such that the are operable along respective substantially parallel first and second lines.

21. The suspension structure of claim 20, further comprising an acceleration sensing mechanism formed within the inner frame member.

22. The suspension structure of claim 21 wherein the acceleration sensing mechanism further comprises:

a proof mass formed in the substrate and suspended for relative rotation from the inner frame member, and a plurality of force/displacement sensors coupled between the proof mass and the inner frame member; and the first and second flexures are oriented such that the are operable along respective lines substantially passing through one of a center of percussion, a center of mass, and a center of gravity of the proof mass.

23. An apparatus comprising:

a silicon substrate formed with substantially planar and parallel opposing offset upper and lower surfaces;

an outer frame structure formed in the substrate;

an inner frame structure formed in the substrate, the inner frame structure being at least partially surrounded by the outer frame structure and separated therefrom by a space; and a plurality of isolators formed in the substrate and extending between the upper and lower surfaces thereof, each of the isolators comprising a pair of inner flexures and a pair of outer flexures spaced away therefrom, proximal ends of each of the inner and outer flexures being interconnected, distal ends of the inner flexures being interconnected with the inner frame structure, and distal ends of the outer flexures being interconnected with the outer frame structure.

24. The apparatus of claim 23 wherein the pair of inner flexures are spaced away from the pair of outer flexures by the space separating the inner frame member from the outer frame member.

25. The apparatus of claim 23 wherein the inner and outer flexures are elongated between the respective proximal and distal ends thereof.

26. The apparatus of claim 23 wherein each of the plurality of isolators further comprises a beam formed in the substrate and extending between the upper and lower surfaces thereof, the beam being interconnected between the proximal ends of each of the inner and outer flexures.

27. The apparatus of claim 26 wherein the respective pairs of inner and outer flexures of each of the plurality of isolators are spaced apart by the beam interconnected therebetween.

28. The apparatus of claim 27 wherein the respective pairs of inner and outer flexures of each of the plurality of isolators are substantially parallel.

29. The apparatus of claim 23 wherein two of the plurality of isolators are positioned on opposite sides of the inner frame structure.

30. The apparatus of claim 23 wherein the outer frame structure further comprises the pair of outer flexures of each of the plurality of isolators.

31. The apparatus of claim 23 wherein the inner frame structure further comprises the pair of inner flexures of each of the plurality of isolators.

32. The apparatus of claim 23 wherein the inner frame structure further comprises:

a proof mass suspended by one or more flexures from the inner frame structure; and a pair of force/displacement sensors coupled between the proof mass and the inner frame structure for measuring forces applied to the proof mass.

33. The apparatus of claim 32 wherein the force/displacement sensors further comprise mechanical resonators formed as double-ended tuning fork (DETF) force sensors.

34. An accelerometer comprising:

a silicon substrate having substantially parallel and spaced apart top and bottom surfaces;

an accelerometer sensor mechanism having a inner sensor frame and proof mass formed in the substrate, the proof mass suspended pendulum fashion within the inner sensor frame by one or more flexures, and two mechanical resonators interconnected in push-pull fashion between the proof mass and the inner sensor frame;

an outer frame formed in the substrate and substantially surrounding and spaced away from the accelerometer sensor mechanism; and a plurality of strain-isolating suspension members positioned in the space between the accelerometer sensor mechanism and the outer frame and coupled between the accelerometer sensor mechanism and the outer frame, pairs of the strain-isolating suspension members positioned on opposite sides of the accelerometer sensor mechanism, each of the strain-isolating suspension members being formed in the substrate and comprising:

a first thin and elongated flexure having first and second ends coupled to an inner wall of the outer frame, and a second thin and elongated flexure having first and second ends coupled to an inner wall of the outer frame opposite from the first flexure, a portion of the second flexure intermediate between the first and second ends being interconnected to the first flexure at a portion thereof intermediate between the first and second ends thereof.

35. The accelerometer of claim 34 wherein the first and second ends of the first flexure of each of the plurality of strain-isolating suspension members is coupled to the inner wall of the outer frame along a portion extending substantially the entire distance between the top and bottom surfaces of the substrate.

36. The accelerometer of claim 34 wherein the first and second ends of the second flexure of each of the plurality of strain-isolating suspension members is coupled to the outer wall of the inner frame along a portion extending substantially the entire distance between the top and bottom surfaces of the substrate.

37. The accelerometer of claim 34 wherein each of the plurality of strain-isolating suspension members further comprises a beam interconnecting the first and second flexures, the beam being coupled between the portion of the first flexure intermediate between the first and second ends thereof and the second flexure intermediate between the first and second ends thereof.

38. The accelerometer of claim 34 wherein the second flexures of each of the plurality of strain-isolating suspension members is spaced away from and aligned substantially parallel with the respective first flexures thereof.

39. The accelerometer of claim 34 wherein one of the pairs of the strain-isolating suspension members positioned on opposite sides of the accelerometer sensor mechanism is further aligned to act through a center of percussion of the proof mass.

40. The accelerometer of claim 34 wherein one of the pairs of the strain-isolating suspension members positioned on opposite sides of the accelerometer sensor mechanism is further aligned to act through a center of mass of the proof mass.

41. The accelerometer of claim 34 wherein one of the pairs of the strain-isolating suspension members positioned on opposite sides of the accelerometer sensor mechanism is further aligned to act through a center of gravity of the proof mass.

42. A method for suspending and isolating an apparatus comprising:

substantially surrounding an inner frame member with an outer frame member spaced apart therefrom by a slot formed between an inner peripheral edge of the outer frame member and an outer peripheral edge of the inner frame member;

interconnecting a plurality of first flexures spaced about the inner peripheral edge of the outer frame member;

interconnecting a plurality of second flexures spaced about the outer peripheral edge of the inner frame member at a position opposite from a corresponding one of the first flexures; and interconnecting a center portion of each of the second flexures with a center portion of the corresponding first flexure.

43. The method of claim 42, further comprising:

positioning a first pair of the first and second interconnected flexures on a first side of the inner frame member; and positioning a second pair of the first and second interconnected flexures on a second side of the inner frame member opposite from the first pair of the first and second interconnected flexures.

44. The method of claim 42, further comprising forming each of inner frame member, the outer frame member, and each of the first and second flexures in a substrate and extending between substantially parallel spaced apart surfaces of the substrate.

45. The method of claim 44, further comprising forming each of the first and second flexures to extend through substantially the entire thickness between the spaced apart surfaces of the substrate.

46. The method of claim 42, further comprising converting into a torque a strain transmitted by each of the first and second flexures.

47. The method of claim 46 wherein converting into a torque a strain transmitted by each of the first and second flexures further comprises converting the strain into equal and opposite torques at opposite ends of the second flexures.

48. The method of claim 42, further comprising providing as part of the inner frame member a means for measuring acceleration applied along an input axis.

\* \* \* \* \*